(12) United States Patent
Lee et al.

(10) Patent No.: US 12,213,342 B2
(45) Date of Patent: *Jan. 28, 2025

(54) DISPLAY DEVICE AND PIXEL ARRAY SUBSTRATE THEREOF

(71) Applicant: LG DISPLAY CO., LTD., Seoul (KR)

(72) Inventors: Dong-Joo Lee, Paju-si (KR); Min Gook, Paju-si (KR); Seong-Hwan Woo, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/386,902

(22) Filed: Nov. 3, 2023

(65) Prior Publication Data

US 2024/0065028 A1 Feb. 22, 2024

Related U.S. Application Data

(63) Continuation of application No. 17/133,986, filed on Dec. 24, 2020, now Pat. No. 11,849,604.

(30) Foreign Application Priority Data

Dec. 26, 2019 (KR) .......................... 10-2019-0175197

(51) Int. Cl.
*H10K 59/121* (2023.01)
*H10K 59/00* (2023.01)
*H10K 59/122* (2023.01)

(52) U.S. Cl.
CPC .......... *H10K 59/121* (2023.02); *H10K 59/00* (2023.02); *H10K 59/122* (2023.02)

(58) Field of Classification Search
CPC ..... H10K 59/121; H10K 59/353; H10K 59/65
See application file for complete search history.

(56) References Cited

U.S. PATENT DOCUMENTS 11,849,604 B2 * 12/2023 Lee ...................... H10K 59/121
2016/0141353 A1   5/2016 Kim et al.
2021/0184155 A1 * 6/2021 Chae .................... H10K 59/122

FOREIGN PATENT DOCUMENTS

| CN | 109755282 A | 5/2019 |
| CN | 110047897 A | 7/2019 |
| CN | 209056269 U | 7/2019 |
| TW | 201939733 A | 10/2019 |

OTHER PUBLICATIONS

Chinese Office Action dated Dec. 14, 2023 issued in Patent Application No. 202011472658.4 w/English Translation (13 pages).

* cited by examiner

*Primary Examiner* — Daniel P Shook
(74) *Attorney, Agent, or Firm* — Fish & Richardson P.C.

(57) ABSTRACT

A display device includes a pixel array including a plurality of pixels, and a sensor disposed below the pixel array that includes a first region having a low resolution and overlapping the sensor, and a second region having a high resolution and disposed adjacent to the first region, the first region includes a plurality of first pixels having a first structure, the second region includes a plurality of second pixels having a second structure different from the first structure, and a light-emitting region of each of the first pixels is wider than a light-emitting region of each of the second pixels.

15 Claims, 9 Drawing Sheets

DISPLAY DEVICE AND PIXEL ARRAY SUBSTRATE THEREOF

CROSS-REFERENCE TO RELATED APPLICATIONS

The present application is a continuation of U.S. patent application Ser. No. 17/133,986, filed on Dec. 24, 2020, which claims the priority of Korean Patent Application No. 10-2019-0175197, filed on Dec. 26, 2019, which are hereby incorporated by reference in their entirety.

BACKGROUND

Field of the Disclosure

The present disclosure relates to a display device and a pixel array substrate thereof. More specifically, the present disclosure relates to a display device including various types of sensors and a pixel array substrate thereof.

Description of the Background

As display devices that display images using digital image data, liquid crystal displays (LCDs) using liquid crystal and organic light-emitting diode display devices using organic light-emitting diodes (OLEDs) are mainly used.

An organic light-emitting diode display device is a display device using self-luminous elements that emit light by themselves and has an advantage of rapid response speed and high light emission efficiency, luminance, and viewing angles as compared to an LCD. In addition, elements may be formed on a flexible substrate such as plastic so that a flexible display device may be implemented.

A display device performs complex functions by adding various functions. For example, an electronic device may perform a mobile communication function, a data communication function, an image capturing function, a voice recording function, and the like. Recently, various components such as cameras, sensors, and the like for implementing multimedia functions have been introduced into the display device. However, since these components are disposed outside a display area, there is an increasing need for a display device in which at least one surface of the display device is substantially extended to an entire surface.

SUMMARY

Accordingly, the present disclosure is directed to a display device and a pixel array substrate thereof that substantially obviate one or more of the problems due to limitations and disadvantages described above.

The present disclosure is to provide a full-screen display device in which at least one surface of the display device is substantially extended to an entire surface and a pixel array substrate thereof.

The present disclosure is also to provide a display device including a sensor in a display area of the display device and a pixel array substrate thereof.

The present disclosure is also to provide a display device having uniform luminance.

The present disclosure is further to solve the above-described necessity and/or problem.

The scope of the present disclosure is not limited to the above-described features may be clearly understood by those skilled in the art from the following descriptions.

One aspect of the present disclosure provides a display device, which includes a pixel array including a plurality of pixels, and a sensor disposed below the pixel array. The pixel array includes a first region having a low resolution and overlapping the sensor, and a second region having a high resolution and disposed adjacent to the first region. The first region includes a plurality of first pixels having a first structure. The second region includes a plurality of second pixels having a second structure different from the first structure. A light-emitting region of each of the first pixels is wider than a light-emitting region of each of the second pixels.

Another aspect of the present disclosure provides a pixel array substrate, which includes a first pixel region and a second pixel region having a higher resolution than the first pixel region. The first pixel region includes a plurality of first pixels having a first structure. The second pixel region includes a plurality of second pixels having a second structure different from the first structure. A light-emitting region of each of the first pixels is wider than a light-emitting region of each of the second pixels.

Advantages and features of the disclosure will be set forth in part in the description which follows and in part will become apparent to those having ordinary skill in the art upon examination of the following or may be learned from practice of the disclosure. Other advantages and features of the aspects herein may be realized and attained by the structure particularly pointed out in the written description and claims hereof as well as the appended drawings.

It is to be understood that both the foregoing general description and the following detailed description are explanatory and are intended to provide further explanation of the aspects as claimed.

BRIEF DESCRIPTION OF THE DRAWINGS

The accompanying drawings, which are included to provide a further understanding of the disclosure, are incorporated in and constitute a part of the present disclosure, illustrate implementations of the disclosure and together with the description serve to explain the principles of aspects of the disclosure.

BRIEF DESCRIPTION OF THE DRAWINGS

Figure 1:
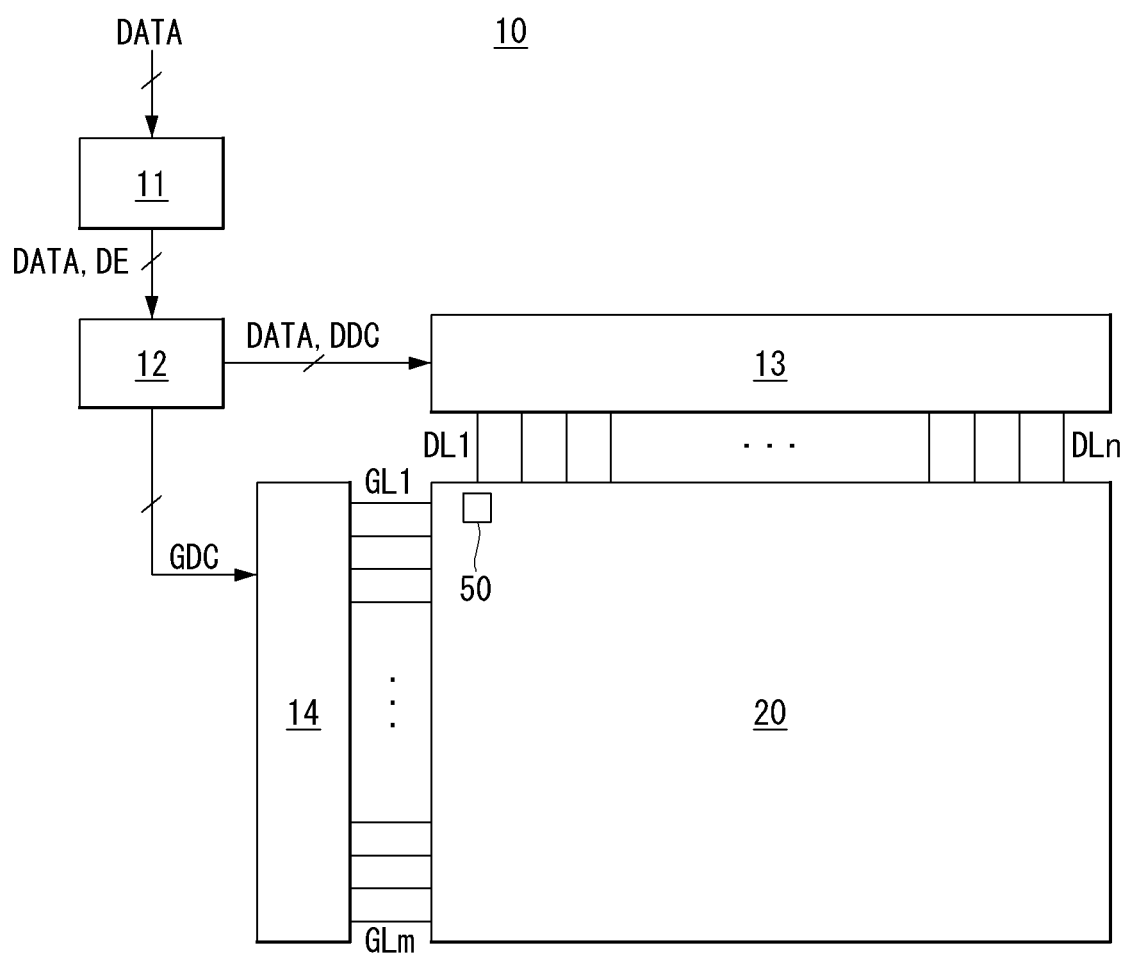

The accompanying drawings, which are included to provide a further understanding of the disclosure and are incorporated in and constitute a part of the disclosure, illustrate aspects of the disclosure and together with the description serve to explain the principle of the disclosure.

Figure 2:
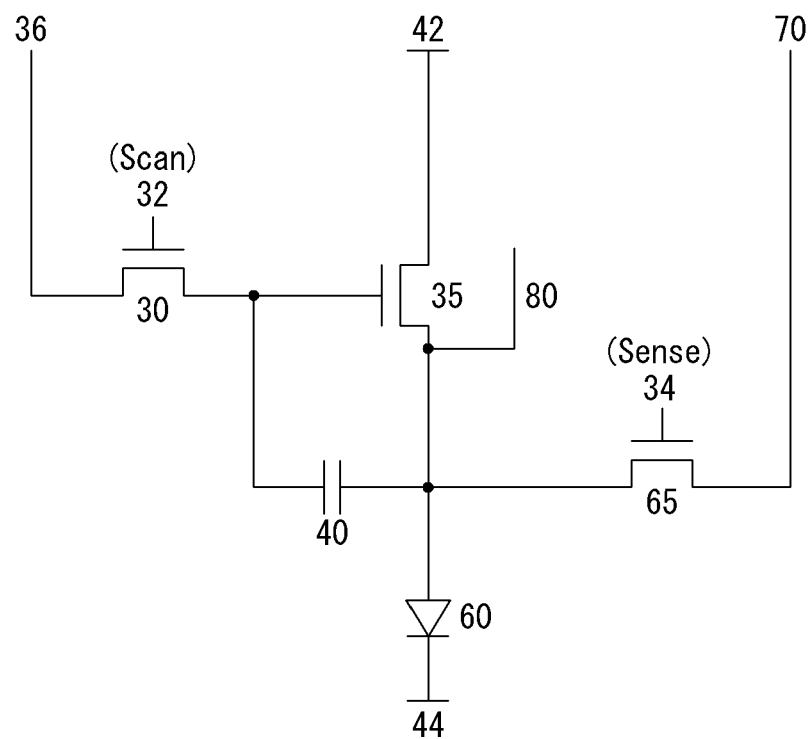
Figure 3:
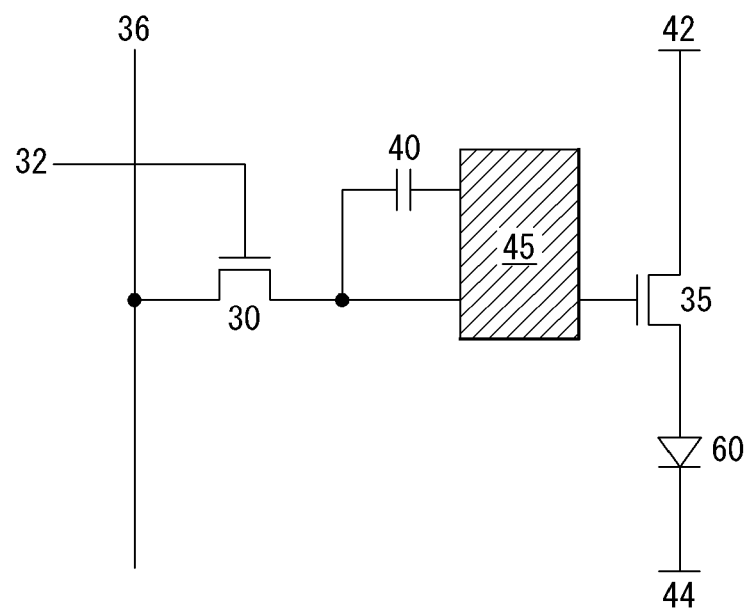
Figure 4:
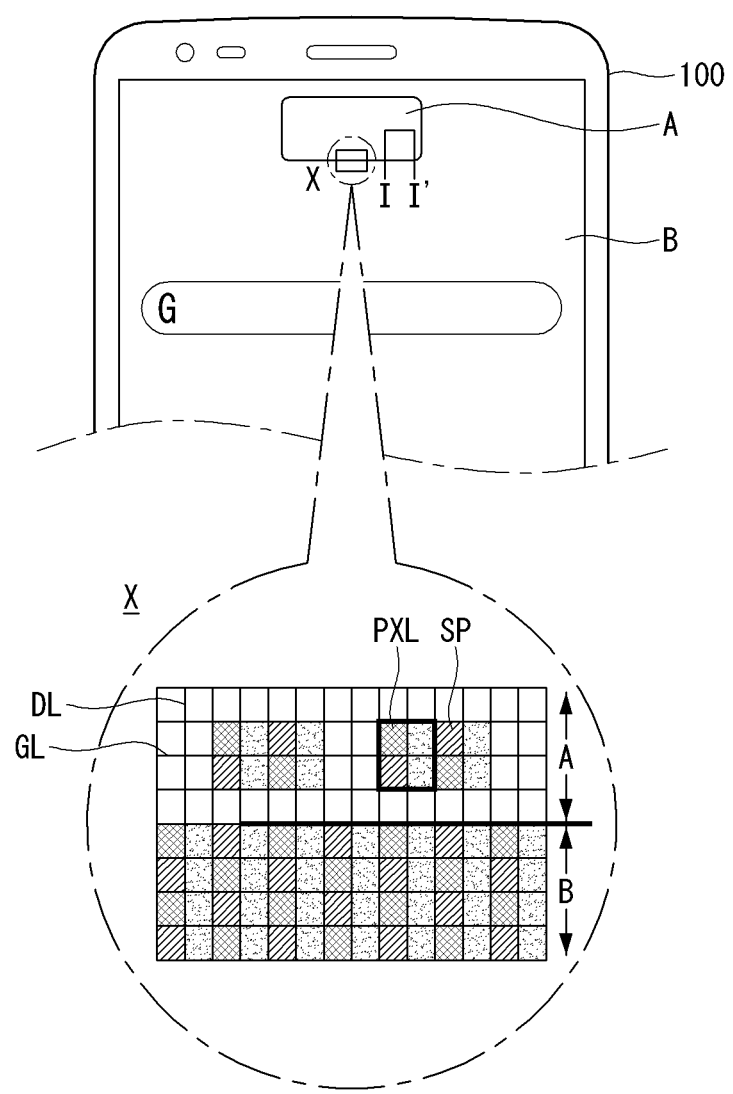
Figure 5:
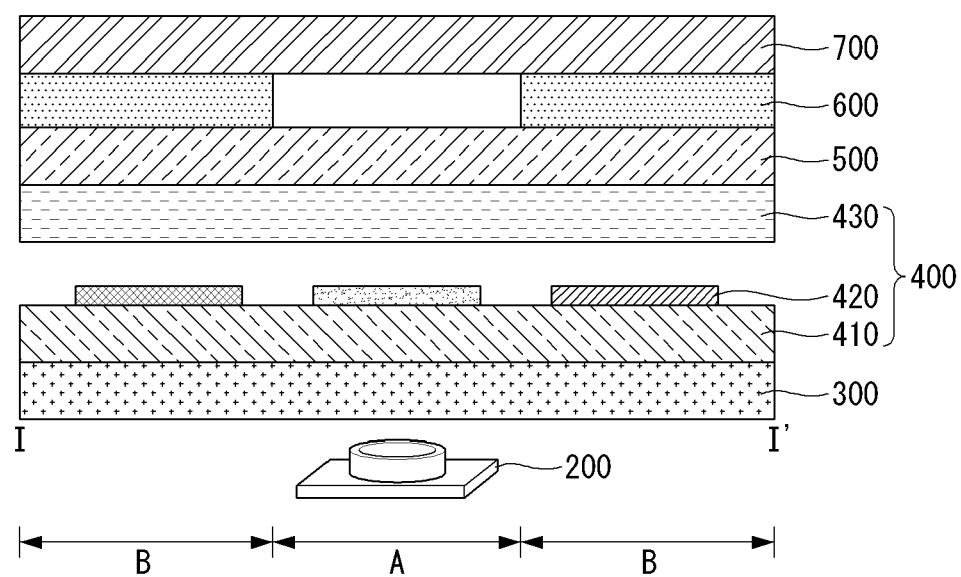
Figure 6:
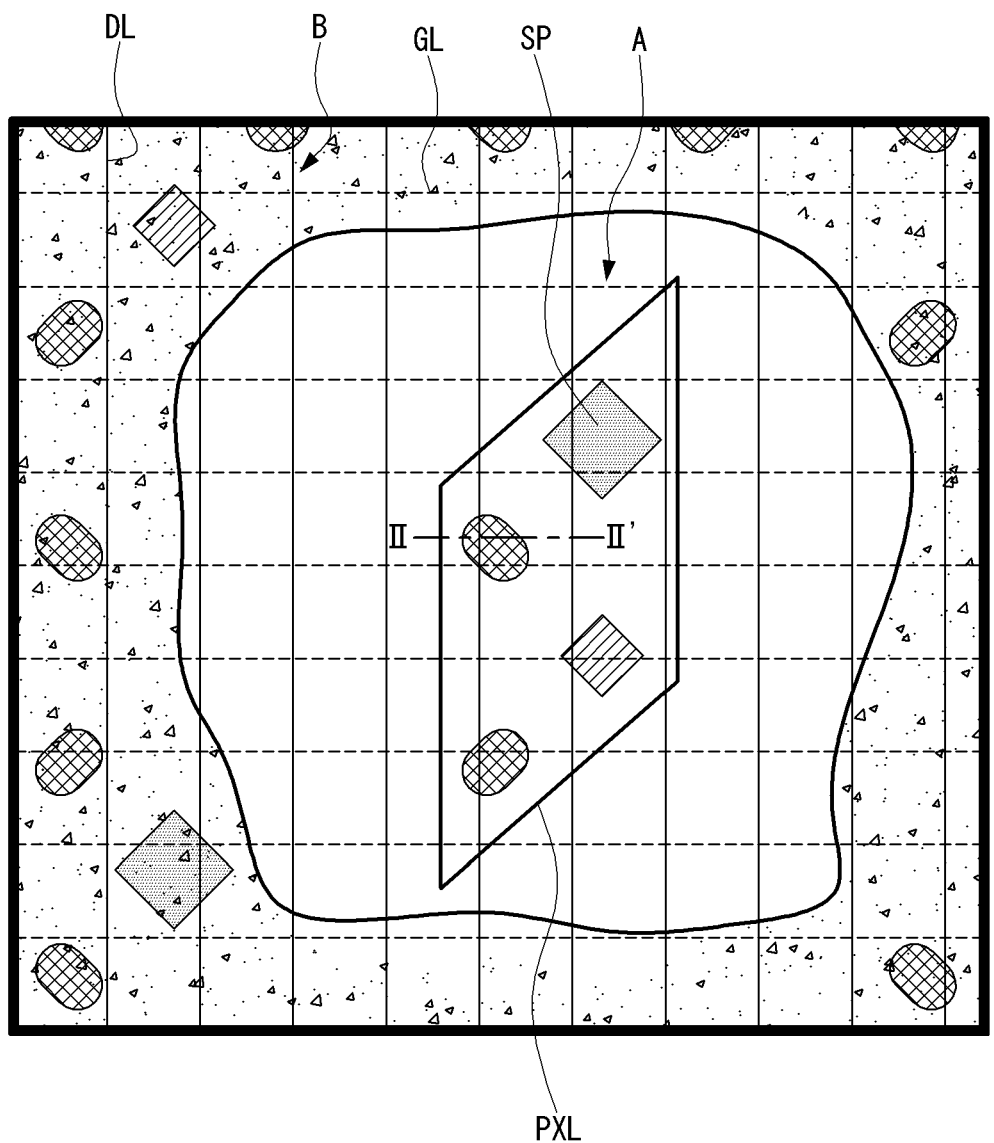
Figure 7:
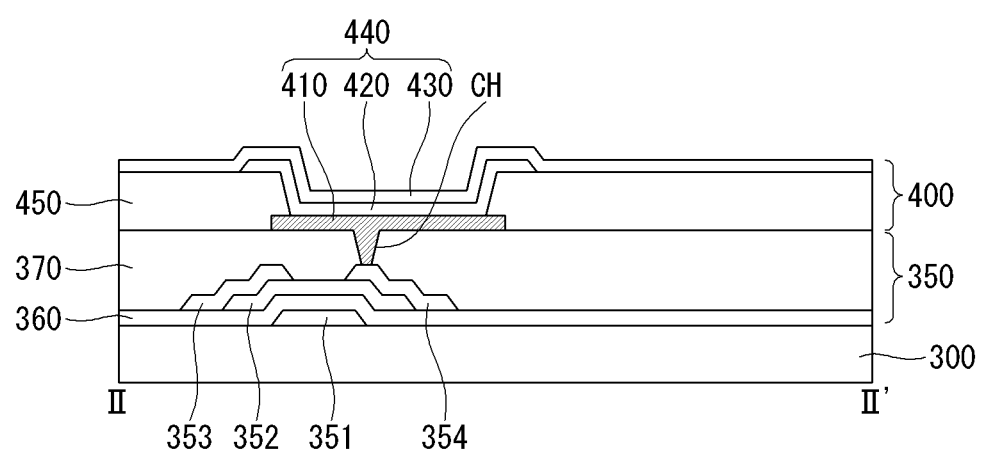
Figure 8:
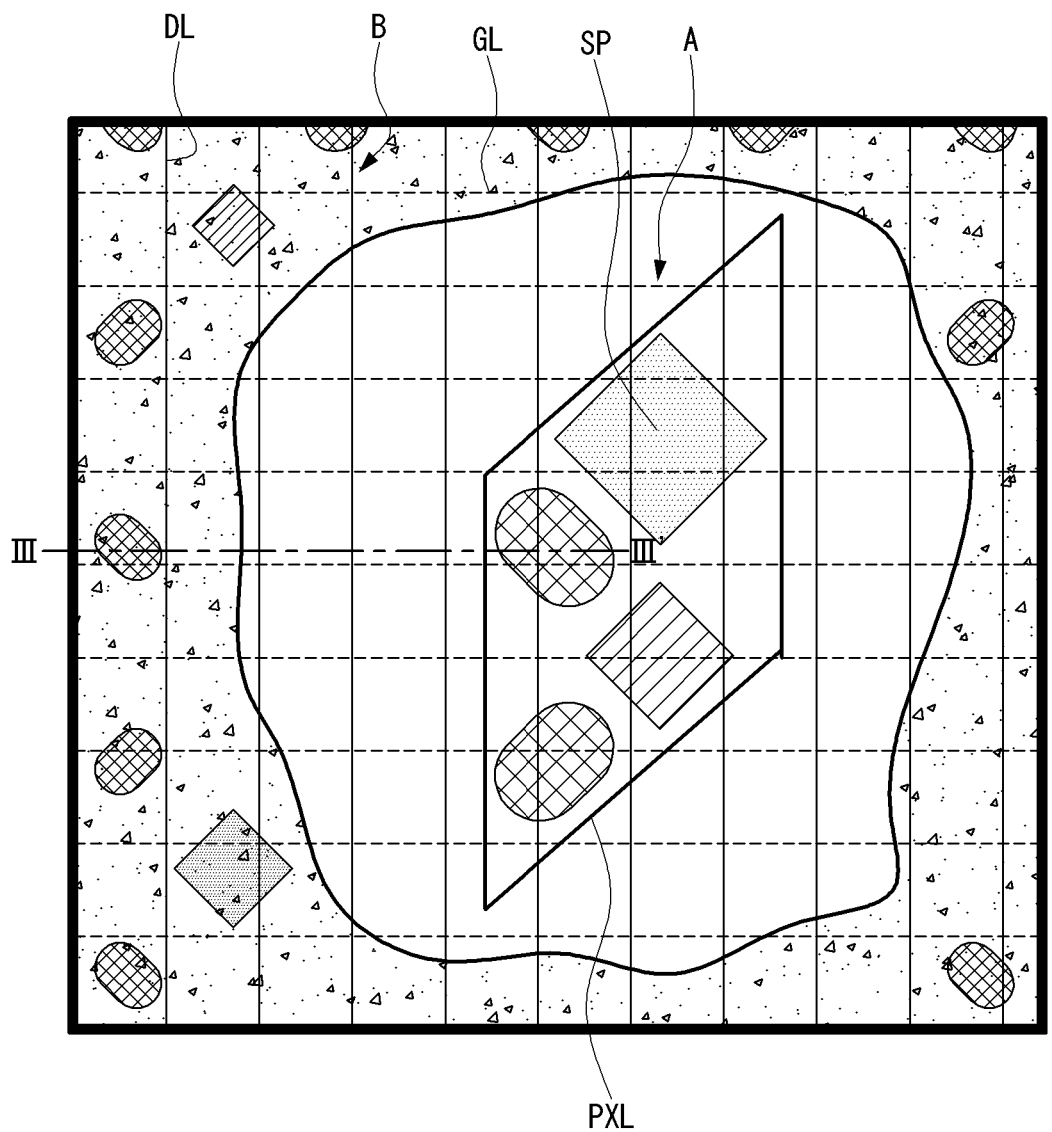
Figure 9:
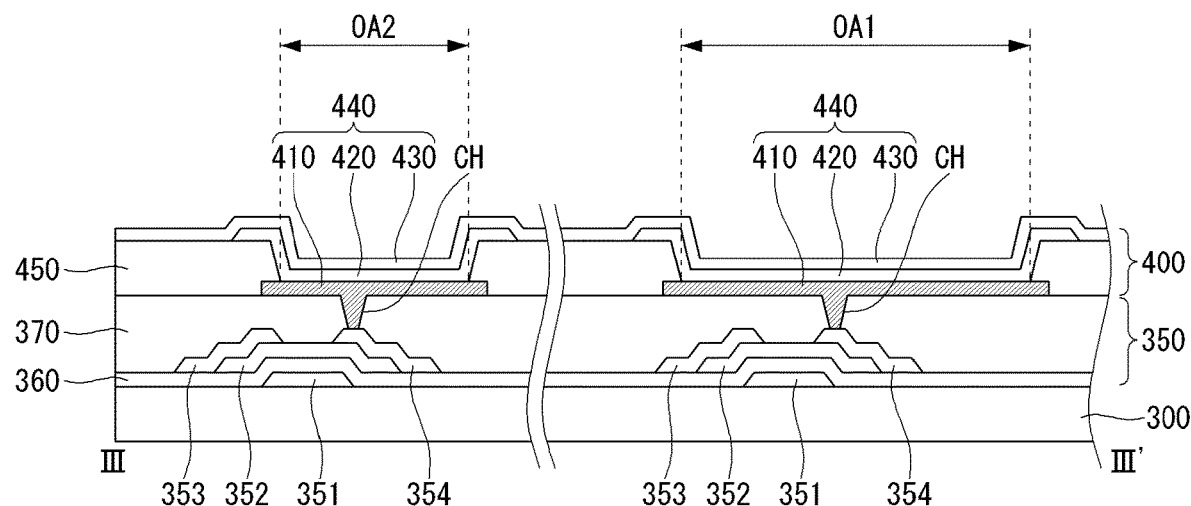
Figure 10A:
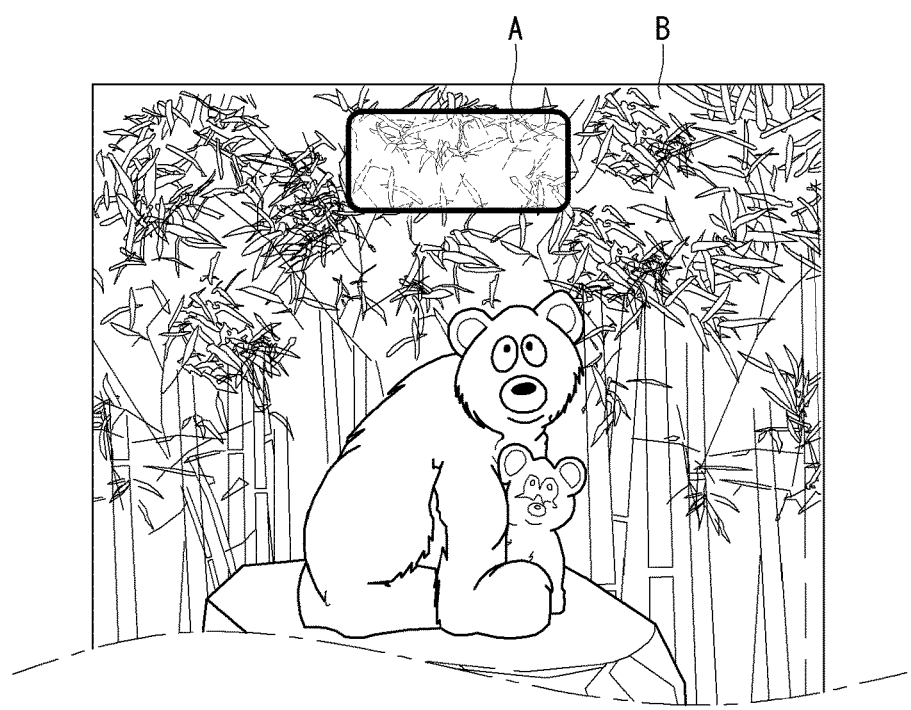
Figure 10B:
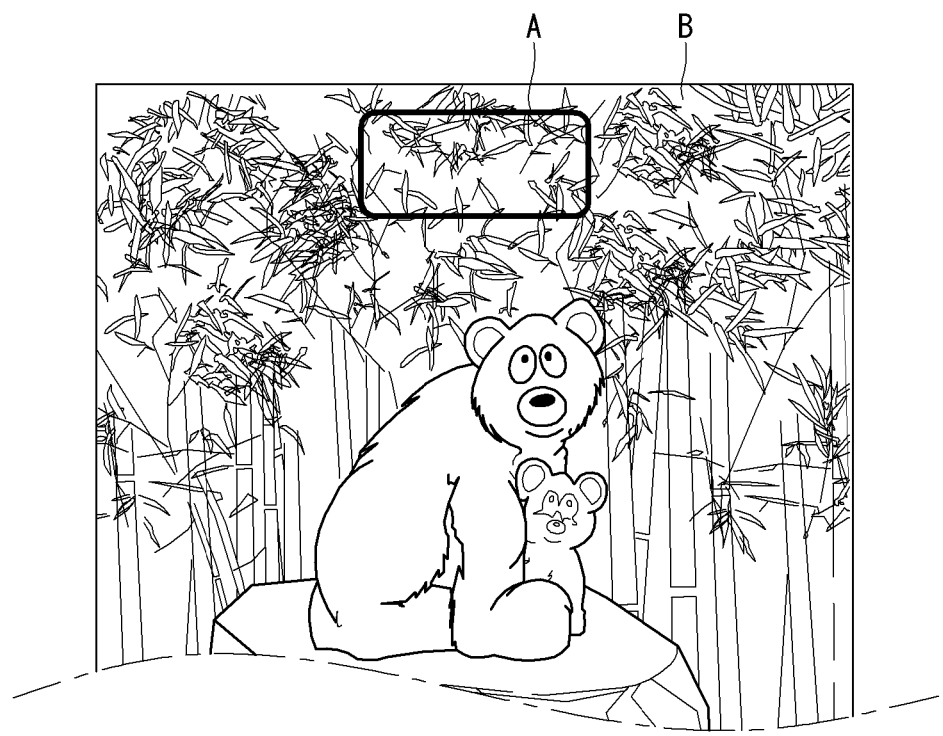
Figure 11:
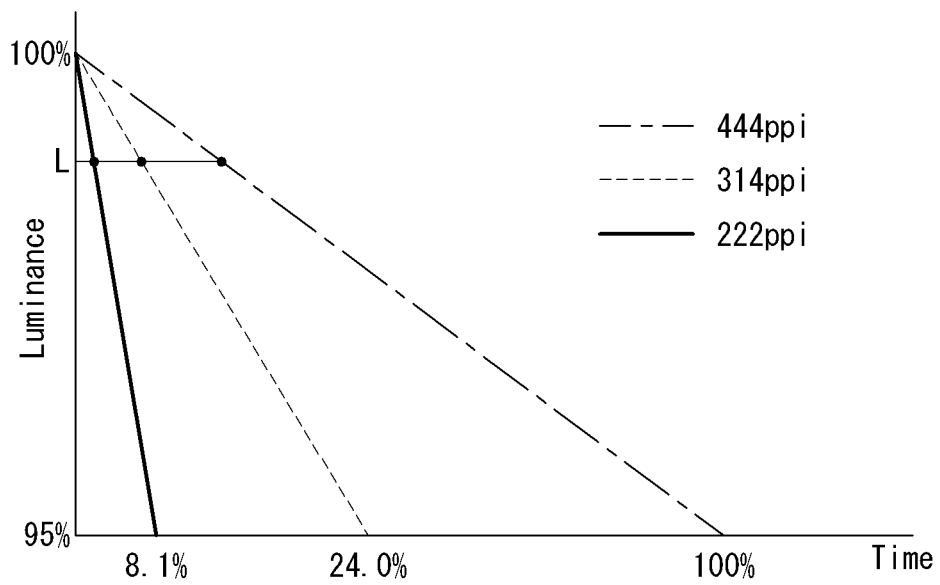

In the drawings:

FIG. 1 is a schematic block diagram of an organic light-emitting diode display device;

FIG. 2 is a schematic circuit diagram of a subpixel;

FIG. 3 is a diagram illustrating an example of a detailed circuit configuration of a subpixel;

FIG. 4 is an exemplary diagram illustrating a partial region of a display device according to an aspect of the present disclosure;

FIG. 5 is a cross-sectional view illustrating an example taken along line I-I' of FIG. 4;

FIG. 6 is a plan view illustrating an example of a pixel of a display device according to an aspect of the present disclosure;

FIG. 7 is a cross-sectional view illustrating an example taken along line II-IF of FIG. 6;

FIG. 8 is a plan view illustrating an example of a pixel of a display device according to another aspect of the present disclosure;

FIG. 9 is a cross-sectional view illustrating an example taken along line of FIG. 8;

FIG. 10A is an exemplary diagram illustrating a partial region of a display device in which luminance compensation is not performed on a region having low pixels per inch (PPI);

FIG. 10B is an exemplary diagram illustrating a partial region of a display device according to an aspect of the present disclosure; and FIG. 11 is a graph showing a lifetime of an organic light-emitting diode according to the number of pixels per unit area (PPI) when an emission area of each pixel is constant.

DETAILED DESCRIPTION

Advantages and features of the present disclosure and methods of achieving the same will be clearly understood with reference to the accompanying drawings and aspects described in detail below. However, the present disclosure is not limited to the aspects to be disclosed below but may be implemented in various different forms. The aspects are provided to fully explain the present aspects and fully explain the scope of the present disclosure for those skilled in the art. The scope of the present disclosure is only defined by the appended claims.

The shapes, sizes, ratios, angles, numbers, etc. disclosed in the drawings for explaining the aspects of the present disclosure are exemplary, and the present disclosure is not limited to the items shown in the drawings. Like reference numerals refer to like elements throughout the specification. In addition, when the present disclosure is described, if it is determined that detailed descriptions of known technology related to the present disclosure unnecessarily obscure the subject matter of the present disclosure, detailed descriptions thereof will be omitted.

When terms such as "including," "having," "consist of," and the like are used herein, other portions may be added unless the terms are used with the term "only." An expression used in the singular may encompass the expression in the plural unless otherwise specifically indicated.

In addition, in interpreting an element, it will be interpreted to include an error range even when there is no separate description.

In the case of a description of a positional relationship, for example, in the case in which a position relationship between two elements is described with the terms "on," "above," "under," "next to," or the like, one or more elements may be interposed therebetween unless the term "directly" is used in the expression.

It will be understood that, although the terms "first," "second," etc. may be used herein to distinguish one element from another element, these elements are not limited in function or structure by an ordinal number or element name in front of the element.

It should be understood that the following aspects may be partially or fully coupled or combined with each other and may be technically communicated in a variety of ways and driven. The aspects may be independently performed or may be performed in communication with each other.

Hereinafter, a display device according to an aspect of this specification will be described with reference to the accompanying drawings. The same reference numerals throughout the specification refer to substantially the same elements. In the following description, if it is determined that detailed descriptions of known functions or configurations related to this specification unnecessarily obscure the subject matter of this specification, detailed descriptions thereof will be omitted or briefly described.

In the display device according to the present disclosure, examples of the display device may include an organic light-emitting diode display device, a liquid crystal display, an electrophoretic display device, and the like, however, in the present disclosure, an example of the organic light-emitting diode display device will be described. The organic light-emitting diode display device includes an organic light-emitting layer made of an organic material between a first electrode, which is an anode, and a second electrode which is a cathode. Therefore, the organic light-emitting diode display device is a self-emissive display device in which holes supplied from the first electrode and electrons supplied from the second electrode are combined in the organic light-emitting layer to form excitons, which are hole-electron pairs, and light is emitted due to energy generated when the excitons return to a ground state.

FIG. 1 is a schematic block diagram of an organic light-emitting diode display device, FIG. 2 is a schematic circuit diagram of a subpixel, and FIG. 3 is a detailed circuit diagram of the subpixel.

As illustrated in FIG. 1, an organic light-emitting diode display device 10 includes an image processor 11, a timing controller 12, a data driver 13, a scan driver 14, and a display panel 20.

The image processor 11 outputs a data signal DATA supplied from the outside, a data enable signal DE, and the like. In addition to the data enable signal DE, the image processor 11 may output one or more of a vertical synchronization signal, a horizontal synchronization signal, and a clock signal, but the signals are omitted for convenience of description.

The timing controller 12 receives the data enable signal DE or a driving signal including the vertical synchronization signal, the horizontal synchronization signal, the clock signal, and the like and the data signal DATA from the image processor 11. The timing controller 12 outputs a gate timing control signal GDC for controlling an operation timing of the scan driver 14 and a data timing control signal DDC for controlling an operation timing of the data driver 13 on the basis of the driving signal.

The data driver 13 samples and latches the data signal DATA supplied from the timing controller 12 in response to the data timing control signal DDC supplied from the timing controller 12, converts the data signal DATA into a gamma reference voltage, and outputs the converted data signal DATA. The data driver 13 outputs the data signal DATA through data lines DL1 to DLn. The data driver 13 may be formed in the form of an integrated circuit (IC).

The scan driver 14 outputs a scan signal in response to the gate timing control signal GDC supplied from the timing controller 12. The scan driver 14 outputs the scan signal through gate lines GL1 to GLm. The scan driver 14 is formed in the form of an IC or formed on the display panel 20 in a gate in panel (GIP) type.

The display panel 20 displays an image in response to the data signal DATA supplied from the data driver 13 and the scan signal supplied from the scan driver 14. The display panel 20 includes subpixels 50 that operate to display the image.

The subpixels 50 include red subpixels, green subpixels, and blue subpixels or include white subpixels, red subpixels, green subpixels, and blue subpixels. The subpixels 50 may have one or more different emission areas according to emission characteristics.

As illustrated in FIG. 2, one subpixel includes a switching transistor 30, a driving transistor 35, a capacitor 40, a compensation circuit 45, and an organic light-emitting diode 60.

The switching transistor 30 performs a switching operation so that a data signal supplied through a first data line 36 is stored in the capacitor 40 as a data voltage in response to a scan signal supplied through a first gate line 32. The driving transistor 35 is operated so that a driving current flows between a first power line 42 (for a high-potential voltage) and a second power line 44 (for a low-potential voltage) according to the data voltage stored in the capacitor 40. The organic light-emitting diode 60 is operated to emit light according to the driving current formed by the driving transistor 35.

The compensation circuit 45 is a circuit added in the subpixel to compensate for a threshold voltage of the driving transistor 35 and the like. The compensation circuit 45 is formed as one or more transistors. The compensation circuit 45 has various configurations according to an external compensation method, and an example of the configuration will be described as follows.

As illustrated in FIG. 3, the compensation circuit 45 includes a sensing transistor 65 and a sensing line 70 (or a reference line). The sensing transistor 65 is connected to a node (hereinafter, referred to as a sensing node) between a source electrode of the driving transistor 35 and an anode electrode of the organic light-emitting diode 60. The sensing transistor 65 is operated to supply an initialization voltage (or a sensing voltage) transmitted through the sensing line 70 to the sensing node of the driving transistor 35 or to sense the sensing node of the driving transistor 35 or a voltage or current of the sensing line 70.

The switching transistor 30 has a first electrode connected to the first data line 36 and a second electrode connected to a gate electrode of the driving transistor 35. The driving transistor 35 has a first electrode connected to the first power line 42 and a second electrode connected to the anode electrode of the organic light-emitting diode 60. The capacitor 40 has a first electrode connected to the gate electrode of the driving transistor 35 and a second electrode connected to the anode electrode of the organic light-emitting diode 60. The organic light-emitting diode 60 has the anode electrode connected to the second electrode of the driving transistor 35 and a cathode electrode connected to the second power line 44. The sensing transistor 65 has a first electrode connected to the sensing line 70 and a second electrode connected to the anode electrode, which is the sensing node, of the organic light-emitting diode 60 and the second electrode of the driving transistor 35.

An operation time of the sensing transistor 65 may be similar to and/or the same as or different from that of the switching transistor 30 according to an external compensation algorithm (or a configuration of the compensation circuit). For example, the switching transistor 30 may have a gate electrode connected to the first gate line 32 and the sensing transistor 65 may have a gate electrode connected to the second gate line 34. In this case, a scan signal Scan is transmitted to the first gate line 32 and a sensing signal Sense is transmitted to the second gate line 34. As another example, the first gate line 32 connected to the gate electrode of the switching transistor 30 and the second gate line 34 connected to the gate electrode of the sensing transistor 65 may be connected to be shared in common.

The sensing line 70 may be connected to the data driver. In this case, the data driver may sense a sensing node of the subpixel in real time or during a non-display period of an image or a period of N frames (N is an integer greater than or equal to 1) and generate a sensing result. Meanwhile, the switching transistor 30 and the sensing transistor 65 may be turned on at the same time. In this case, the sensing operation performed through the sensing line 70 and the data output operation of outputting the data signal are divided (distinguished) from each other according to a time division method of the data driver.

In addition, a compensation target according to the sensing result may be a digital data signal, an analog data signal, a gamma, or the like. Further, a compensation circuit which generates a compensation signal (or a compensation voltage) based on the sensing result may be implemented as an internal circuit of the data driver, an internal circuit of the timing controller, or a separate circuit.

A light blocking layer 80 may be disposed only below a channel region of the driving transistor 35 or disposed below the channel region of the driving transistor 35 as well as below channel regions of the switching transistor 30 and the sensing transistor 65. The light blocking layer 80 may be simply used for blocking external light, or the light blocking layer 80 may be used as an electrode for connecting to other electrodes or lines and constituting a capacitor or the like. Therefore, the light blocking layer 80 is selected as a metal layer of a multi-layer (a multi-layer formed of different types of metals) to have a light blocking characteristic.

In addition, in FIG. 3, an example of the subpixel having a three-transistor, one-capacitor (3T1C) structure including the switching transistor 30, the driving transistor 35, the capacitor 40, the organic light-emitting diode 60, and the sensing transistor 65 is illustrated. However, when the compensation circuit 45 is added, the subpixel may have a 3T2C, 4T2C, 5T1C, or 6T2C structure.

A display device according to a first aspect of the present disclosure will be described with reference to FIGS. 4 to 7.

FIG. 4 is an exemplary diagram illustrating a partial region of the display device according to the aspect of the present disclosure.

FIG. 5 is a cross-sectional view illustrating an example taken along line I-I' of FIG. 4.

FIG. 6 is a plan view illustrating an example of a pixel of the display device according to the aspect of the present disclosure.

FIG. 7 is a cross-sectional view illustrating an example taken along line II-IF of FIG. 6.

Referring to FIG. 4, a display device 100 according to the first aspect of the present disclosure has a pixel array 400 including pixels PXL arranged in a first direction and a second direction crossing the first direction. Each of the pixels PXL may include a plurality of subpixels SP. The subpixels SP include red subpixels SP, green subpixels SP, and blue subpixels SP or include white subpixels SP, red subpixels SP, green subpixels SP, and blue subpixels SP. The subpixels SP may have one or more different emission areas according to emission characteristics.

Referring to FIG. 7, in the display device according to the first aspect of the present disclosure, a display area is defined on a substrate 300, and the display device includes a thin film transistor, an organic light-emitting element 440, an encapsulation layer 500, an insulating film 370, and a bank 450.

Referring to FIGS. 6 and 7, the pixel array 400 of the display device 100 according to the first aspect of the present disclosure includes gate lines GL and data lines DL crossing each other on the substrate 300. The subpixel SP is defined by the gate lines GL and the data lines DL that are orthogonal to each other with a gate insulating film 360 interposed therebetween. The thin film transistor is disposed on one side of the subpixel SP. The thin film transistor includes a gate electrode 351 branched off from the gate line GL, a source electrode 353 branched off from the data line DL, and a drain electrode 354 disposed opposite to the source electrode 353 to be spaced a predetermined interval from the source electrode 353.

A semiconductor layer 352 is formed on the gate insulating film 360 covering the gate electrode 351 to overlap the gate electrode 351. The semiconductor layer 352 has one side in contact with the source electrode 353 and the other side in contact with the drain electrode 354.

The semiconductor layer 352 may be formed of amorphous silicon (a-Si), polycrystalline silicon (poly-Si), an oxide semiconductor, an organic semiconductor, or the like. When the semiconductor layer 352 is formed of an oxide semiconductor, the oxide semiconductor may include indium tin oxide (ITO), indium zinc oxide (IZO), indium gallium zinc oxide (IGZO), indium tin zinc oxide (ITZO), or the like, but the present disclosure is not limited thereto.

The insulating film 370 for protecting an element is formed on the thin film transistor. The insulating film 370 serves as a planarization layer for planarization. A plurality of organic light-emitting elements 440 may be disposed on the insulating film 370. The organic light-emitting element 440 includes a first electrode 410, an organic light-emitting layer 420, and a second electrode 430 that are sequentially stacked.

The first electrode 410 may be an anode. The anode may be an electrode that supplies holes to the organic light-emitting layer 420 and may be formed of a transparent conductive material having a high work function. The transparent conductive material may include ITO, IZO, ITZO, or the like, but the present disclosure is not limited thereto. The first electrode 410 may be in contact with the drain electrode 354 through a contact hole CH formed in the insulating film 370.

The second electrode 430 may be a cathode. The cathode may be an electrode that supplies electrons to the organic layer and may be formed of a metal having a relatively low work function, for example, silver, titanium (Ti), aluminum, molybdenum (Mo), or an alloy of silver and magnesium (Ag:Mg). Here, the cathode may be referred to as a common electrode. When the cathode 133 is formed of an alloy of silver and magnesium, resistance of the cathode may be lowered by increasing a content of silver compared to a content of magnesium. In this case, an ytterbium (YB) layer may be disposed above, below, or above and below the silver and magnesium (Ag:Mg) layer to prevent the resistance from being lowered due to oxidation of silver.

The organic light-emitting layer 420 is disposed between the first electrode 410 and the second electrode 430. Light-emitting layers that emit different colors are formed separately for each subpixel SP. For example, a red organic light-emitting layer 420 for emitting red light, a green organic light-emitting layer 420 for emitting green light, and a blue organic light-emitting layer 420 for emitting blue light may be separately formed in the red subpixel SP, the green subpixel SP, and the blue subpixel SP, respectively. In this case, the red subpixel SP, the green subpixel SP, and the blue subpixel SP may constitute one pixel PXL. In each of the red organic light-emitting layer 420, the green organic light-emitting layer 420, and the blue organic light-emitting layer 420, holes and electrons supplied through the first electrode 410 and the second electrode 430 are combined with each other so that light is emitted. Each of the organic light-emitting layers 420 may be pattern-deposited for each subpixel SP using an open mask, for example, a fine metal mask (FMM). However, the present disclosure is not limited thereto, and the organic light-emitting layer 420 may be commonly formed on all of the subpixels SP on the substrate 300. In this case, the organic light-emitting layer 420 may be made of a material emitting white light, and a color filter may be disposed to correspond to a region in which the organic light-emitting layer 420 emits light.

The organic light-emitting layer 420 may further include organic layers such as an injecting layer and a transporting layer for improving light emission efficiency of the organic light-emitting element 440.

The subpixel SP may be defined by the bank 450, and a portion of an upper surface of the first electrode 410 may be exposed by the bank 450. Specifically, the bank 450 may be disposed to cover an edge of the first electrode 410. The bank 450 is made of an insulating material to insulate the first electrodes 410 of adjacent subpixels SP from each other.

Referring to FIGS. 4 and 6, the pixel array 400 of the display device 100 according to the first aspect of the present disclosure includes a first region A having a low resolution and a second region B having a high resolution. That is, the number of pixels PXL per unit area of the first region A is smaller than the number of pixels PXL per unit area of the second region B. In other words, the first region A corresponds to a region having low pixels per inch (PPI), and the second region corresponds to a region having high PPI.

FIG. 6 is an enlarged view illustrating the first region A, which is a region having low PPI, and the second region B, which is a region having high PPI, in the display device 100 according to the first aspect of the present disclosure and is a schematic plan view illustrating the subpixels SP in the first and second regions A and B.

In FIG. 6, only one pixel PXL including four subpixels SP is illustrated in the first region A, which is the region having low PPI, but this is for convenience of description and, actually, the first region A may include a plurality of pixels PXL. In addition, the subpixels SP illustrated in FIG. 6 are exemplary and the present disclosure is not limited to these shapes and numbers.

The subpixels SP in the second region B, which is the region having high PPI, are formed in regions defined by intersections of the data lines DL and the gate lines GL.

The subpixels SP in the first region A, which is the region having low PPI, are formed in some of the regions defined by the intersections of the data lines DL and the gate lines GL. That is, the subpixels SP may not be formed in some regions formed by the intersections of the data lines DL and the gate lines GL.

As described above, the subpixel SP emits light through the following process. The switching transistor performs a switching operation so that the data signal supplied through the data line DL is stored in the capacitor as a data voltage in response to the scan signal supplied through the gate line GL. The driving transistor is operated so that the driving current flows through the organic light-emitting element 440 according to the data voltage stored in the capacitor. The organic light-emitting element 440 is operated to emit the light according to the driving current formed by the driving transistor.

When the same amount of a driving current flows for each subpixel SP, the first region A, which is the region having low PPI, has a lower luminance than the second region B, which is the region having high PPI. Due to a difference in luminance between the regions, the regions may be clearly distinguished to the user's eyes.

To prevent the above phenomenon, in the display device 100 according to the first aspect of the present disclosure, the amount of the driving current flowing through each region may be made different. More specifically, an amount of a current flowing through the organic light-emitting element 440 in the first region A, which is the region having low PPI, may be made to be greater than an amount of a current flowing through the organic light-emitting element 440 in the second region B, which is the region having high PPI. By making the amount of the current flowing through the organic light-emitting element 440 in the first region A greater than the amount of the current flowing through the organic light-emitting element 440 in the second region B, the difference in luminance between the two regions may be minimized.

Referring to FIG. 5, the display device 100 according to the first aspect of the present disclosure includes a sensor 200 disposed below the pixel array 400. The sensor 200 may include at least one of a camera device, a proximity sensor, an illuminance sensor, a fingerprint recognition sensor, and a biometric sensor. Hereinafter, an example in which the sensor 200 is a camera device is described, but the present disclosure is not limited thereto.

The sensor 200 overlaps the first region A of the pixel array 400. That is, at least a portion of the first region A of the pixel array 400 overlaps the sensor 200. In addition, the second region B does not overlap the sensor 200.

When the sensor 200 is activated, the pixels PXL in the first region A, which is the region overlapping the sensor 200, may be deactivated. For example, in the case in which the sensor 200 is a camera device, when the camera device is activated, the pixels PXL in the first region may be deactivated. When a photograph or image is captured, the camera device should accommodate external light. This is because light emitted from pixels PXL may be mixed with the external light and may affect the quality of the photograph or image.

Hereinafter, a stacked structure of the display device 100 according to the first aspect of the present disclosure will be briefly described with reference to FIG. 5.

A thin film transistor (TFT) layer 350 in which thin film transistors are arranged is disposed on the substrate 300. The pixel array 400 in which the plurality of pixels including the first electrode 410, the organic light-emitting layer 420, and the second electrode 430 are arranged is disposed on the TFT layer 350. The pixel array 400 includes the first region A having a low resolution and the second region B having a high resolution.

The sensor 200 is disposed below the pixel array 400. More specifically, the sensor 200 is disposed below the substrate 300 and disposed to overlap at least a portion of the first region A of the pixel array 400. That is, when viewed from a front surface of the display device 100, the sensor 200 should be disposed to be included in the first region A.

The encapsulation layer 500 is formed on the pixel array 400. The encapsulation layer 500 serves to protect the organic light-emitting layer 420 from moisture and oxygen. This is because the organic light-emitting layer 420 is very vulnerable to the moisture and oxygen. The encapsulation layer 500 may be formed as a metal layer or may be formed by stacking two or more layers of an organic material layer and an inorganic material layer.

A polarizing layer 600 is formed on the encapsulation layer 500. The polarizing layer 600 prevents visibility of the display device 100 from being degraded due to reflection of the external light by various metal materials present in the display device 100. The characteristics for light of the polarizing layer 600 may be different in a region overlapping the first region A from a region overlapping the second region B of the pixel array 400. For example, a polarizing plate having high transmittance may be disposed in the region overlapping the first region A and a polarizing plate having low transmittance may be disposed in the region overlapping the second region B in consideration of the sensor 200 disposed therebelow. As another example, an opening for opening a polarizing plate may be formed in the region overlapping the first region A that needs to increase transmittance of external light. When the opening is formed in the region overlapping the first region A, the transmittance of the external light may be increased and thus a quantity of the external light transmitted into the sensor may be increased.

A cover glass 700 may be formed on the polarizing plate. The cover glass 700 may be made of a material such as glass, and a tempered glass may be used to prevent damage to the display device due to external impact. An opaque printed cover glass may be used in a region except for a region displaying an image.

In the display device 100 according to the first aspect of the present disclosure, the first region A, which is a region having a low resolution, and the sensor 200 are disposed to overlap each other, and thus the external light is easily transmitted into the sensor 200. That is, there is an advantage in that, by making the number of subpixels SP disposed in the first region A overlapping the sensor 200 smaller than the number of subpixels SP disposed in the second region B overlapping the sensor 200, the transmittance of the external light in the first region A may be increased. When the sensor 200 is a camera device, the quality of photograph may be further improved.

By using the above configuration, by arranging the sensor 200 below the display area, it is possible to design a full screen display in which an entire front surface of the display device 100 is a display area.

Hereinafter, differences between a display device 100 according to a second aspect of the present disclosure and the display device 100 according to the first aspect of the present disclosure will be mainly described. Components that are substantially the same as those of the display device 100 according to the first aspect of the present disclosure are denoted by the same reference numerals, and descriptions thereof will be omitted.

Hereinafter, the display device 100 according to the second aspect of the present disclosure will be described in detail with reference to FIGS. 8 and 9.

FIG. 8 is an enlarged view illustrating a first region A, which is a low-resolution region, and a second region B, which is a high-resolution region, in the display device 100 according to the second aspect of the present disclosure and is a schematic plan view illustrating pixels PXL in the first and second regions A and B.

In FIG. 8, only one pixel PXL including four subpixels SP is illustrated in the first region A, which is the low-resolution region, but this is for convenience of description and, actually, the first region A may include a plurality of pixels PXL. In addition, subpixels SP illustrated in FIG. 8 are exemplary and the present disclosure is not limited to these shapes and numbers.

FIG. 9 is a cross-sectional view illustrating an example taken along line of FIG. 8.

The pixels PXL of the display device 100 according to the second aspect of the present disclosure include a plurality of first pixels which are located in the first region A and each of which have a plurality of subpixels SP, and a plurality of second pixels which are located in the second region B and each of which have a plurality of subpixels SP. The first pixel has a first structure and the second pixel has a second structure different from the first structure. Specifically, an emission area of the first pixel is greater than an emission area of the second pixel. More specifically, an emission area OA1 of each of the subpixels SP included in the first pixel may be greater than an emission area OA2 of each of the subpixels SP of the second pixel.

For example, when a ratio of the number of first pixels, which is the number of pixels per unit area of the first region, to the number of second pixels, which is the number of pixels per unit area of the second region, is 1:n (n is a real number greater than 1), a ratio of an area of a light-emitting region of each of the first pixels to an area of a light-emitting region of each of the second pixels may be n:1. In other words, the ratio of the area of the light-emitting region of each of the first pixels to the area of the light-emitting region of each of the second pixels may be inversely proportional to the ratio of the number of first pixels to the number of second pixels.

To make the emission area of the first pixel and the emission area of the second pixel different, the first electrodes 410 allocated to the respective subpixels SP may be formed to have different sizes. That is, an area of the first electrode 410 disposed on the TFT layer 350 in the first region A may differ from an area of the first electrode 410 disposed above the TFT layer 350 in the second region B. The first electrodes 410 having different areas may be formed through a fine metal mask (FMM) process. The FMM process may be a process using a single mask or a process using a plurality of masks. For example, the first electrode 410 located in the first region A and the first electrode 410 located in the second region B may be separately deposited using separate masks. As still another example, the first electrode 410 located in the first region A and the first electrode 410 located in the second region B may be deposited in a single process using one mask.

The first electrode 410 may be made of a highly transparent conductive material. The transparent conductive material may include ITO, IZO, ITZO, and the like, but the present disclosure is not limited thereto. The first electrode 410 may be in contact with the drain electrode 354 through the contact hole CH formed in the insulating film 370, as described above.

Thereafter, the bank 450 that may define the subpixel SP may be formed on the first electrode 410. A portion of the upper surface of the first electrode 410 may be exposed by the bank 450. Specifically, the bank 450 may be disposed to cover the edge of the first electrode 410. In this case, areas of the exposed portions of the first electrodes 410 correspond to the emission areas OA1 and OA2 of the subpixel SP. Therefore, to form a light-emitting region having a specific area, the first electrode 410 may be formed to have an area greater than the specific area, and the first electrode 410 exposed by the bank 450 covering the edge of the first electrode 410 may have the above specific area.

More specifically, when it is assumed that the exposed portion of the first electrode 410 in the first region A exposed by the bank 450 is referred to as a first exposed portion and the exposed portion of the first electrode 410 in the second region B exposed by the bank 450 is referred to as a second exposed portion, an area of the first exposed portion may be greater than an area of the second exposed portion. When the ratio of the number of first pixels, which is the number of pixels per unit area of the first region, to the number of second pixels, which is the number of pixels per unit area of the second region, is 1:n (n is a real number greater than 1), a ratio of the area of the first exposed portion to the area of the second exposed portion may be n:1. In other words, the ratio of the area of the first exposed portion to the area of the second exposed portion may be inversely proportional to the ratio of the number of first pixels to the number of second pixels.

The area of the first exposed portion may be the same as the emission area OA1 of each of the subpixels SP included in the first pixel, and the area of the second exposed portion may be the same as the emission area OA2 of each of the subpixels SP included in the second pixel. The bank 450 is made of an insulating material to insulate the first electrodes 410 of adjacent subpixels SP from each other.

The organic light-emitting layer 420 is formed on the first electrode 410 exposed by the bank 450. A subpixel SP representing red, green, blue, or white may be formed according to the characteristic of the organic light-emitting material. The organic light-emitting layer 420 formed in the first region A may be formed to cover the first electrode 410 in the first region A. The organic light-emitting layer 420 formed in the second region B may be formed to cover the first electrode 410 in the second region B. When the area of the first electrode 410 exposed by the bank 450 in the first region A is greater than the area of the first electrode 410 exposed by the bank 450 in the second region B, an area of the organic light-emitting layer 420 formed in the first region A is greater than an area of the organic light-emitting layer 420 formed in the second region B.

The organic light-emitting layer 420 may be formed through a FMM process. When the FMM process is used, an area of a pattern of a FMM corresponding to the first region A may be greater than an area of a pattern of a FMM corresponding to the second region B.

The FMM process may be a process using a single mask or a process using a plurality of masks. For example, the first electrode 410 located in the first region A and the first electrode 410 located in the second region B may be separately deposited using separate masks. As still another example, the first electrode 410 located in the first region A and the first electrode 410 located in the second region B may be deposited in a single process using one mask.

The second electrode 430 is formed on the organic light-emitting layer 420. For example, the second electrode 430 may be entirely deposited through a mask process using a common mask. In addition, to increase transmittance of external light to be transmitted into the sensor 200, a portion of the second electrode 430 in the first region A may be etched and removed. More specifically, the second electrode 430 formed as a common layer in the first region A may be divided into a portion in direct contact with the organic light-emitting layer 420 and a portion not in direct contact with the organic light-emitting layer 420, and the portion not in direct contact with the organic light-emitting layer 420 may be partially removed. As another example, the second electrode 430 may be deposited using a fine pattern of the FMM so that the second electrode 430 covers the organic light-emitting layer 420 and overlaps a portion of the bank 450.

In another aspect, when viewed from the front of a display screen, the display device according to the second aspect of the present disclosure has a pixel array substrate including a first pixel region and a second pixel region having a higher resolution than the first pixel region.

The first pixel region of the pixel array substrate according to the aspect of the present disclosure includes a plurality of first pixels having a first structure, and the second pixel region includes a plurality of second pixels having a second structure different from the first structure. A light-emitting region of each of the first pixels is wider than a light-emitting region of each of the second pixels.

For example, a ratio of an area of the light-emitting region of each of the first pixels to an area of the light-emitting region of each of the second pixels may be inversely proportional to a ratio of the number of pixels per unit area of the first pixel region to the number of pixels per unit area of the second pixel region.

As another example, when the ratio of the number of pixels per unit area of the first pixel region to the number of pixels per unit area of the second pixel region is 1:n, the ratio of the area of the light-emitting region of each of the first pixels to the area of the light-emitting region of each of the second pixels may be n:1.

Each of the pixels included in the pixel array substrate may include a plurality of subpixels, and each of the subpixels may include a first electrode, an organic light-emitting layer disposed on the first electrode, a second electrode disposed on the organic light-emitting layer, and a bank disposed to cover a portion of the first electrode. The organic light-emitting layer may cover a portion of the first electrode and a portion of the bank, and the second electrode may be disposed to cover the organic light-emitting layer and the bank.

The first electrode may have an exposed portion exposed by the bank. The exposed portion may include a first exposed portion by which the first electrode in the first pixel region is exposed, and a second exposed portion by which the first electrode in the second pixel region is exposed. An area of the first exposed portion may be greater than an area of the second exposed portion.

For example, a ratio of the area of the first exposed portion to the area of the second exposed portion may be inversely proportional to the ratio of the number of pixels per unit area of the first pixel region to the number of pixels per unit area of the second pixel region.

As another example, when the ratio of the number of pixels per unit area of the first pixel region to the number of pixels per unit area of the second pixel region is 1:n, the ratio of the area of the first exposed portion to the area of the second exposed portion may be n:1.

Since the light-emitting region is defined by the size of the exposed portion, the area of the exposed portion may be regarded as the area of the light-emitting region.

The display device 100 according to the second aspect of the present disclosure is compared to the display device 100 according to the first aspect of the present disclosure with reference to FIGS. 10 and 11.

FIG. 10A is a view illustrating a display device in which luminance compensation is not performed on a first region.

FIG. 10B is a view illustrating the display device according to the aspect of the present disclosure.

FIG. 11 is a graph showing a lifetime of an organic light-emitting diode according to the number of pixels per unit area when an emission area of each pixel is constant. Here, the number of pixels per unit area is defined as pixels per inch (PPI).

Referring to FIG. 10A, in the case of the display device in which luminance compensation is not performed on a first region A, a difference in luminance between the first region A and a second region B is generated due to a difference in the number of pixels per unit area between the first region A and the second region B. Due to the difference in luminance between the first region A and the second region B, the two regions are easily distinguished by visual inspection, which adversely affects the quality of an image.

Referring to FIG. 10B, the display device 100 according to the aspect of the present disclosure may compensate for the difference in luminance between the first region A and the second region B. As a result, the difference in luminance between the first region A and the second region B may be minimized. Accordingly, the first region A and the second region B may not be distinguished by visual inspection.

FIG. 11 is a graph showing the lifetime of the organic light-emitting element according to the number of pixels per unit area (PPI) on the basis of a white organic light-emitting diode. It is assumed that a second region B, which is a region having high PPI, has 444 ppi, and a first region A, which is a region having low PPI, has 222 ppi or 314 ppi. In order for the two regions to have the same luminance, an amount of a current flowing through the organic light-emitting element 440 in the first region A may be increased. For convenience of description, when the second region B, that is, the region having 444 ppi, has an arbitrary reference luminance L, a lifetime of the corresponding organic light-emitting element 440 is assumed to be 100(%).

In the case in which the first region A has 222 ppi, when the amount of the current flowing through the organic light-emitting element 440 is increased to have the reference luminance L, the lifetime of the organic light-emitting element 440 in the first region A is 8.1(%) compared to the lifetime of the organic light-emitting element 440 in the second region B.

In the case in which the first region A has 314 ppi, when the amount of the current flowing through the organic light-emitting element 440 is increased to have the reference luminance L, the lifetime of the organic light-emitting element 440 in the first region A is 24.0(%) compared to the lifetime of the organic light-emitting element 440 in the second region B.

That is, when the amount of the current flowing through the organic light-emitting element 440 in the region having low PPI is increased to compensate for the difference in luminance between the two regions, the lifetime of the organic light-emitting element 440 in the region having low PPI is reduced.

In the display device 100 according to the second aspect of the present disclosure, to compensate for the difference in luminance between the region having low PPI and the region having high PPI, an area of the light-emitting region of the organic light-emitting element 440 in the region having low PPI is increased. For example, since the number of pixels per unit area of the region having 222 ppi is ¼ of the number of pixels per unit area of the region having 444 ppi, each pixel in the region having 222 ppi may have a light-emitting region that is four times as wide as that of each pixel in the region having 444 ppi. As still another example, since the number of pixels per unit area of the region having 314 ppi is about ½ of the number of pixels per unit area of the region having 444 ppi, each pixel in the region having 314 ppi may have a light-emitting region that is about twice as wide as that of each pixel in the region having 444 ppi.

In summary, in the case of the display device 100 according to the second aspect of the present disclosure, to compensate for the difference in luminance between the first region A and the second region B, the emission area of the light-emitting element located in the first region A, that is, the area of the first electrode 410 exposed by the bank 450, is increased. When the emission area of the organic light-emitting element 440 is increased, the luminance may be increased in proportion to the emission area and, accordingly, the difference in luminance between the first region A and the second region B may be minimized or eliminated. Unlike the display device 100 according to the first aspect of the present disclosure in which the difference in luminance between the first region A and the second region B is compensated for by increasing the amount of the current, in the case of the display device 100 according to the second aspect of the present disclosure, there is an advantage in that the difference in luminance between the two regions may be compensated for without shortening the lifetime of the light-emitting element.

Various examples of the display device and the pixel array substrate of the present disclosure are summarized as follows.

Example 1: a display device includes a pixel array including a plurality of pixels and a sensor disposed below the pixel array, the pixel array includes a first region having a low resolution and overlapping the sensor, and a second region having a high resolution and disposed adjacent to the first region, wherein the first region includes a plurality of first pixels having a first structure, the second region includes a plurality of second pixels having a second structure different from the first structure, and a light-emitting region of each of the first pixels is wider than a light-emitting region of each of the second pixels.

Example 2: a ratio of an area of the light-emitting region of each of the first pixels to an area of the light-emitting region of each of the second pixels may be inversely proportional to a ratio of the number of pixels per unit area of the first region to the number of pixels per unit area of the second region.

Example 3: when the ratio of the number of pixels per unit area of the first region to the number of pixels per unit area of the second region is 1:n, the ratio of the area of the light-emitting region of each of the first pixels to the area of the light-emitting region of each of the second pixels may be n:1.

Example 4: each of the pixels may include a plurality of subpixels, and each of the plurality of subpixels may include a first electrode, an organic light-emitting layer disposed on the first electrode, and a second electrode disposed on the organic light-emitting layer.

Example 5: the display device may further include a bank disposed to cover a portion of the first electrode, the organic light-emitting layer may cover a portion of the first electrode and a portion of the bank, and the second electrode may be disposed to cover the organic light-emitting layer and the bank.

Example 6: the first electrode may include an exposed portion exposed by the bank, the exposed portion may include a first exposed portion located in the first region and a second exposed portion located in the second region, and an area of the first exposed portion may be greater than an area of the second exposed portion.

Example 7: a ratio of the area of the first exposed portion to the area of the second exposed portion may be inversely proportional to a ratio of the number of pixels per unit area of the first region to the number of pixels per unit area of the second region.

Example 8: when the ratio of the number of pixels per unit area of the first region to the number of pixels per unit area of the second region is 1:n, the ratio of the area of the first exposed portion to the area of the second exposed portion may be n:1.

Example 9: the pixel array substrate includes a first pixel region and a second pixel region having a higher resolution than the first pixel region, wherein the first pixel region includes a plurality of first pixels having a first structure, the second pixel region includes a plurality of second pixels having a second structure different from the first structure, and a light-emitting region of each of the first pixels is wider than a light-emitting region of each of the second pixels.

Example 10: a ratio of an area of the light-emitting region of each of the first pixels to an area of the light-emitting region of each of the second pixels may be inversely proportional to a ratio of the number of pixels per unit area of the first pixel region to the number of pixels per unit area of the second pixel region.

Example 11: when the ratio of the number of pixels per unit area of the first pixel region to the number of pixels per unit area of the second pixel region is 1:n, the ratio of the area of the light-emitting region of each of the first pixels to the area of the light-emitting region of each of the second pixels may be n:1.

Example 12: each of the pixels may include a plurality of subpixels, and each of the plurality of subpixels may include a first electrode, an organic light-emitting layer disposed on the first electrode, and a second electrode disposed on the organic light-emitting layer.

Example 13: the pixel array substrate may further include a bank disposed to cover a portion of the first electrode, the organic light-emitting layer may cover the first electrode and the portion of the bank, and the second electrode may be disposed to cover the organic light-emitting layer and the bank.

Example 14: the first electrode may include an exposed portion exposed by the bank, the exposed portion may include a first exposed portion by which the first electrode in the first pixel region is exposed and a second exposed portion by which the first electrode in the second pixel region is exposed, and an area of the first exposed portion may be greater than an area of the second exposed portion.

Example 15: a ratio of the area of the first exposed portion to the area of the second exposed portion may be inversely proportional to a ratio of the number of pixels per unit area of the first pixel region to the number of pixels per unit area of the second pixel region.

Example 16: when the ratio of the number of pixels per unit area of the first pixel region to the number of pixels per unit area of the second pixel region is 1:n, the ratio of the area of the first exposed portion to the area of the second exposed portion may be n:1.

A pixel array substrate and a display device including the same according to the aspect of the present disclosure may provide a full screen display device by mounting a sensor such as a camera device or the like below the pixel array.

A pixel array substrate a display device including the same according to the aspect of the present disclosure may provide a display device having uniform luminance. More specifically, the pixel array substrate and the display device including the same according to the aspect of the present disclosure may provide a display device having uniform luminance without reducing the lifetime of pixels.

Effects of the present disclosure are not limited to the above-described effects and other unmentioned effects may be clearly understood by those skilled in the art from the above detailed descriptions and the scope of claims.

It will be apparent to those skilled in the art that various modifications and variations can be made in the display device and a pixel array substrate thereof of the present disclosure without departing from the spirit or scope of the aspects of the present disclosure. Thus, it is intended that the present disclosure covers the modifications and variations of the aspects provided they come within the scope of the appended claims and their equivalents.

What is claimed is:

1. A display device comprising:
 a pixel array including a plurality of pixels;
 a sensor disposed below the pixel array,
 wherein the pixel array includes a first region having a low resolution and overlapping with the sensor and a second region having a high resolution and disposed adjacent to the first region,
 wherein the first region includes a plurality of first pixels having a first structure, and the second region includes a plurality of second pixels having a second structure,
 wherein an area of a light-emitting region of the first pixels is larger than an area of a light-emitting region of the second pixels, and
 wherein a distance between adjacent subpixels of each of the first pixels is different from a distance between adjacent subpixels of each of the second pixels.

2. The display device of claim 1, wherein the light-emitting region of each of the first pixels is wider than the light-emitting region of each of the second pixels.

3. The display device of claim 1, wherein a ratio of the area of the light-emitting region of each of the first pixels to the area of the light-emitting region of each of the second pixels is inversely proportional to a ratio of the number of pixels per unit area of the first region to the number of pixels per unit area of the second region.

4. The display device of claim 1, wherein, when a ratio of the number of pixels per unit area of the first region to the number of pixels per unit area of the second region is 1:n, a ratio of an area of the light-emitting region of each of the first pixels to an area of the light-emitting region of each of the second pixels is n:1.

5. The display device of claim 1, wherein each of the pixels includes a plurality of subpixels; and each of the plurality of subpixels includes a first electrode, an organic light-emitting layer disposed on the first electrode, and a second electrode disposed on the organic light-emitting layer.

6. The display device of claim 5, further comprising a bank disposed to cover a portion of the first electrode.

7. The display device of claim 6, wherein the organic light-emitting layer covers a portion of the first electrode and a portion of the bank, and the second electrode is disposed to cover the organic light-emitting layer and the bank.

8. The display device of claim 6, wherein the first electrode includes an exposed portion exposed by the bank, and wherein the exposed portion includes a first exposed portion located in the first region and a second exposed portion located in the second region, and an area of the first exposed portion is greater than an area of the second exposed portion.

9. The display device of claim 8, wherein a ratio of the area of the first exposed portion to the area of the second exposed portion is inversely proportional to a ratio of the number of pixels per unit area of the first region to the number of pixels per unit area of the second region.

10. The display device of claim 8, wherein, when a ratio of the number of pixels per unit area of the first region to the number of pixels per unit area of the second region is 1:n, a ratio of the area of the first exposed portion to the area of the second exposed portion is n:1.

11. The pixel array substrate of claim 1, wherein the distance between adjacent subpixels of each of the first pixels is smaller than the distance between adjacent subpixels of each of the second pixels.

12. The pixel array substrate of claim 1, wherein the first pixels of the first region are deactivated when the sensor is activated.

13. The pixel array substrate of claim 1, further comprising a first polarizer disposed in the first region and a second polarizer disposed in the second region, wherein the first polarizer has transmittance higher than the second polarizer.

14. The pixel array substrate of claim 1, further comprising a polarizer disposed in the second region and no polarizer disposed in the first region.

15. A display device comprising:
 a pixel array including a plurality of pixels; and
 a sensor disposed below the pixel array,
 wherein the pixel array includes a first region having a low resolution and overlapping with the sensor and a second region having a high resolution and disposed adjacent to the first region,
 wherein the first region includes a plurality of first pixels having a first structure, and the second region includes a plurality of second pixels having a second structure,
 wherein an area of a light-emitting region of the first pixels is larger than an area of a light-emitting region of the second pixels, and
 wherein a ratio of the area of the light-emitting region of each of the first pixels to the area of the light-emitting region of each of the second pixels is inversely proportional to a ratio of the number of pixels per unit area of the first region to the number of pixels per unit area of the second region.

* * * * *